US012696698B2

(12) United States Patent
Breil et al.

(10) Patent No.: US 12,696,698 B2
(45) Date of Patent: Jul. 28, 2026

(54) MIDDLE OF LINE DIELECTRIC LAYER ENGINEERING FOR VIA VOID PREVENTION

(71) Applicant: Applied Materials, Inc., Santa Clara, CA (US)

(72) Inventors: Nicolas Louis Breil, San Jose, CA (US); Abhijit B. Mallick, Fremont, CA (US); Balasubramanian Pranatharthiharan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 355 days.

(21) Appl. No.: 18/472,062

(22) Filed: Sep. 21, 2023

(65) Prior Publication Data

US 2024/0105509 A1 Mar. 28, 2024

Related U.S. Application Data

(60) Provisional application No. 63/409,657, filed on Sep. 23, 2022, provisional application No. 63/409,658, filed on Sep. 23, 2022.

(51) Int. Cl.
*H10P 14/692* (2026.01)
*H10W 20/00* (2026.01)

(52) U.S. Cl.
CPC ..... *H10P 14/69215* (2026.01); *H10W 20/056* (2026.01); *H10W 20/081* (2026.01)

(58) Field of Classification Search
CPC ......... H01L 21/02164; H01L 21/76802; H01L 21/76877; H10P 14/69215; H10W 20/056; H10W 20/081; H10W 20/42
See application file for complete search history.

(56) References Cited

U.S. PATENT DOCUMENTS

2005/0287764 A1 12/2005 Doris et al.
2011/0210448 A1* 9/2011 Nitta ................. H01L 21/31111
257/774

(Continued)

FOREIGN PATENT DOCUMENTS

EP 0798776 A2 10/1997
JP H8316321 A 11/1996

(Continued)

OTHER PUBLICATIONS

Taiwan Office Action issued to patent application No. 112136274 on Aug. 25, 2025.

(Continued)

*Primary Examiner* — Changhyun Yi
(74) *Attorney, Agent, or Firm* — Patterson + Sheridan, LLP

(57) ABSTRACT

Embodiments of the present disclosure are provide a method for fabricating a semiconductor device with fewer via voids (e.g., gaps between a dielectric layer and a metal fill of the semiconductor device). One such technique involves forming a dielectric layer, wherein at least a portion of the dielectric layer comprises a nonstoichiometric compound; forming one or more openings in the dielectric layer; filling the one or more openings with a metal, wherein the metal is disposed on a surface of each of the one or more openings; and exposing the dielectric layer and metal disposed in the openings to an oxidizing atmosphere, wherein exposing the dielectric layer and metal in the openings causes oxidation of the nonstoichiometric compound.

11 Claims, 3 Drawing Sheets

(56) References Cited

U.S. PATENT DOCUMENTS

| | | | |
|---|---|---|---|
| 2012/0112270 | A1 | 5/2012 | Park et al. |
| 2015/0076554 | A1 | 3/2015 | Laven et al. |
| 2015/0102456 | A1 | 4/2015 | Lin et al. |
| 2016/0111374 | A1 | 4/2016 | Brink et al. |
| 2018/0130657 | A1 | 5/2018 | Duan et al. |
| 2018/0277482 | A1 | 9/2018 | Briggs et al. |
| 2018/0308694 | A1 | 10/2018 | Chen et al. |
| 2020/0194304 | A1 | 6/2020 | Roy et al. |
| 2021/0104433 | A1 | 4/2021 | Mukherjee et al. |

FOREIGN PATENT DOCUMENTS

| | | |
|---|---|---|
| JP | 2006229207 A | 8/2006 |
| JP | 2007142311 A | 6/2007 |
| JP | 2020530663 A | 10/2020 |
| KR | 100588643 B1 | 6/2006 |
| KR | 1020080061485 A | 7/2008 |
| KR | 1020130133690 A | 12/2013 |

OTHER PUBLICATIONS

International Search Report/ Written Opinion issued to PCT/US2023/033384 on Jan. 12, 2024.

International Search Report/ Written Opinion issued to PCT/US2023/033406 on Jan. 15, 2024.

Korean Office Action issued to patent application No. 10-2025-7013033 on Aug. 28, 2025.

Office Action from Japanese Patent Application No. 2025-516159 dated Mar. 31, 2026.

Office Action from Taiwanese Patent Application No. 112136275 dated Mar. 27, 2026.

Office Action from Japanese Patent Application No. 2025-516189 dated May 12, 2026.

* cited by examiner

100

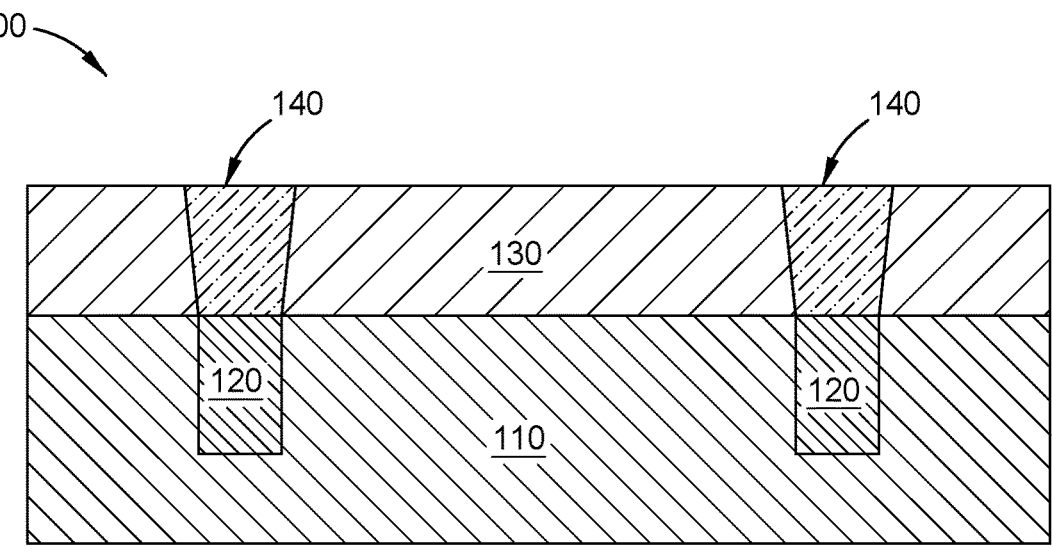

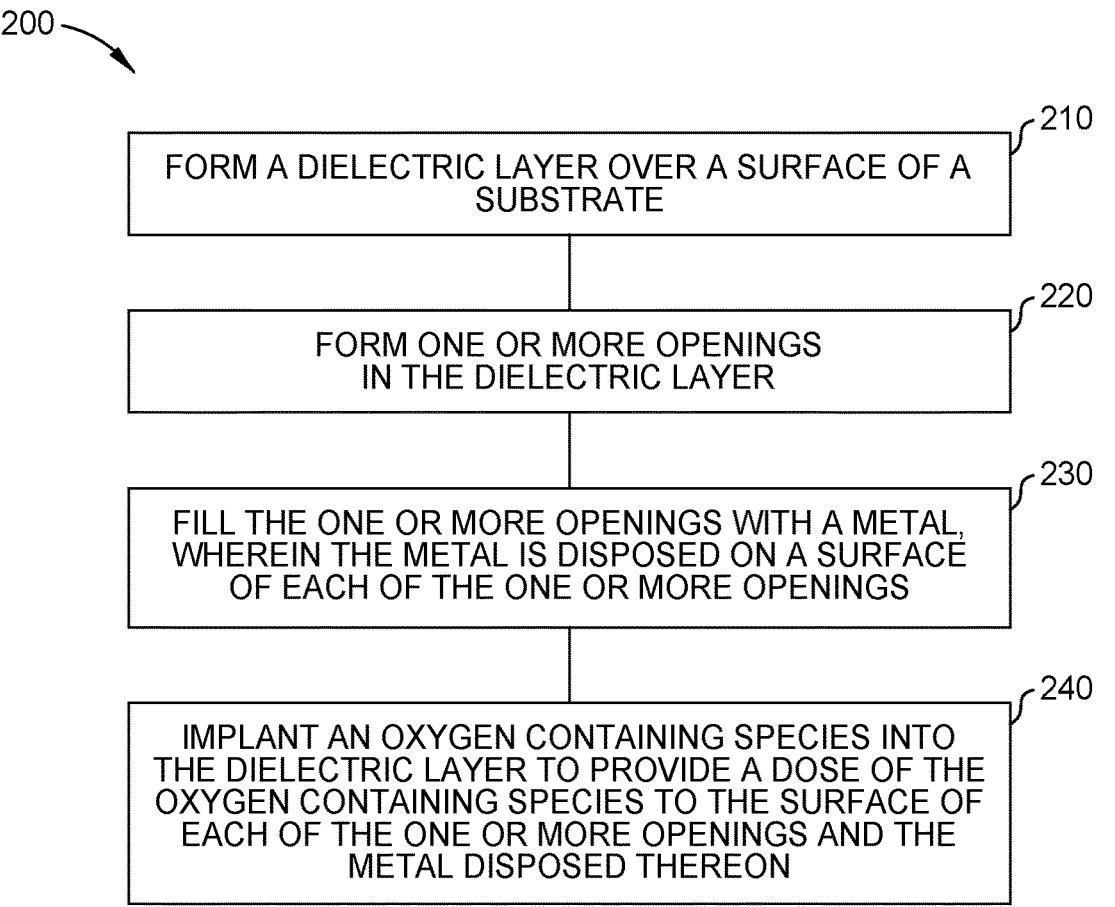

FORM A DIELECTRIC LAYER OVER A SURFACE OF A SUBSTRATE ⌐210

FORM ONE OR MORE OPENINGS IN THE DIELECTRIC LAYER ⌐220

FILL THE ONE OR MORE OPENINGS WITH A METAL, WHEREIN THE METAL IS DISPOSED ON A SURFACE OF EACH OF THE ONE OR MORE OPENINGS ⌐230

IMPLANT AN OXYGEN CONTAINING SPECIES INTO THE DIELECTRIC LAYER TO PROVIDE A DOSE OF THE OXYGEN CONTAINING SPECIES TO THE SURFACE OF EACH OF THE ONE OR MORE OPENINGS AND THE METAL DISPOSED THEREON ⌐240

FIG. 2

MIDDLE OF LINE DIELECTRIC LAYER ENGINEERING FOR VIA VOID PREVENTION

CROSS-REFERENCE TO RELATED APPLICATIONS

This application claims the benefit of U.S. Provisional Application 63/409,657 filed on Sep. 23, 2022, and U.S. Provisional Application 63/409,658 filed on Sep. 23, 2022 which are hereby incorporated by reference in their entirety.

BACKGROUND

Field

Embodiments of the present disclosure generally relate to a method for fabricating a semiconductor device.

Description of the Related Art

Reliably producing sub-100 nm and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success, and to the continued effort to increase circuit density and quality of individual substrate and die.

As circuit densities increase for next generation devices, the widths of interconnects, such as vias, trenches, contacts, gate structures, and other features, as well as the dielectric materials therebetween, decrease to 45 nm and 32 nm dimensions or below, whereas the thickness of the dielectric layer remain substantially constant, with the result of increasing the aspect ratios of the features. In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. 3D stacking of semiconductor chips reduces wire lengths and keeps wiring delay low. In manufacturing, 3D stacking of semiconductor chips, stairlike structures are often utilized to allow multiple interconnection structures to be disposed thereon, forming high-density of vertical transistor devices.

Conventional interconnect formation processes and interconnect designs lead to the formation of high resistance structures due to the materials used in conventionally configured devices. In conventional methods, via fill is completed with metal barrier, liner, and bulk filling metal. Metal barriers and liners are used for reliability and gap-fill robustness. However, the materials used for the barrier and liner layer (such as titanium nitride (TiN) or tantalum nitride (TaN)) typically have high resistivities, which may lead to a high interconnect resistance when deposited at via bottom. Interconnect resistance will influence the speed of a formed device as a result of RC delay and power loss due to the IR drop. As design rules continually shrink, interconnect resistance reduction becomes an increasingly important priority. In particular, interconnect resistance weighs significantly on the overall resistance with short interconnect lines, smaller via dimension (e.g., below 40 nm), and multiple layer routings with via stack, i.e. there may be a higher resistance through the interconnects than there is through the lines. Therefore, reducing interconnect resistance has become increasingly important to achieve chip performance.

Thus, there is a continual need for improved methods of forming interconnects to decrease the manufacturing costs, memory cell size, and power consumption of the integrated circuits and solve the problems described above.

SUMMARY

One or more embodiments of the present disclosure are directed to a method for fabricating a semiconductor device. The method comprises forming a dielectric layer, wherein at least a portion of the dielectric layer comprises a nonstoichiometric compound; forming one or more openings in the dielectric layer; filling the one or more openings with a metal, wherein the metal is disposed on a surface of each of the one or more openings; and exposing the dielectric layer and metal disposed in the openings to an oxidizing atmosphere, wherein exposing the dielectric layer and metal in the openings causes oxidation of the nonstoichiometric compound.

One or more embodiments of the disclosure are directed to a method for fabricating a semiconductor device. The method comprises exposing a patterned dielectric layer disposed on a substrate to an oxidizing atmosphere. The patterned dielectric layer comprises a first dielectric layer that comprises a plurality of openings that each comprise a metal layer that is disposed on a surface of the opening, and the first dielectric layer comprises a nonstoichiometric compound. Exposing the patterned dielectric layer to an oxidizing atmosphere causes oxidation of the nonstoichiometric compound at the surfaces of the openings.

One or more embodiments of the present disclosure are directed to a method for fabricating a semiconductor device. The method comprises forming a dielectric layer over a surface of a substrate, forming one or more openings in the dielectric layer, filling the one or more openings with a metal wherein the metal is disposed on a surface of each of the one or more openings, and implanting an oxygen containing species into the dielectric layer to provide a dose of the oxygen containing species to the surface of each of the one or more openings and the metal disposed thereon.

One or more embodiments of the present disclosure are directed to a method for fabricating a semiconductor device. The method comprises implanting an oxygen containing species into a patterned dielectric layer disposed on a substrate. The patterned dielectric layer comprises a dielectric layer that comprises a plurality of openings that each comprise a metal layer that is disposed on a surface of the opening, and the implanting of the oxygen containing species into the dielectric layer provides a dose of the oxygen containing species to the surface of each of the plurality of openings and the metal layer disposed thereon. Heating the patterned dielectric layer after implanting the oxygen containing species to cause the surface of each of the plurality of openings and the metal layer exposed to the dose of the oxygen containing species to oxidize.

One or more embodiments of the present disclosure are directed to a semiconductor device comprising a substrate, a patterned dielectric layer disposed over the substrate, the patterned dielectric layer comprising a plurality of openings, a metal layer that is disposed on a surface of the plurality of openings, and a metal oxide layer at an interface between the metal layer and a surface of the plurality openings.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 1 illustrates a side cross-sectional view of interconnects formed on a substrate, in which one or more embodiments of the present disclosure may be implemented.

FIG. 2 illustrates a method for fabricating a semiconductor device, according to one or more embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 3:
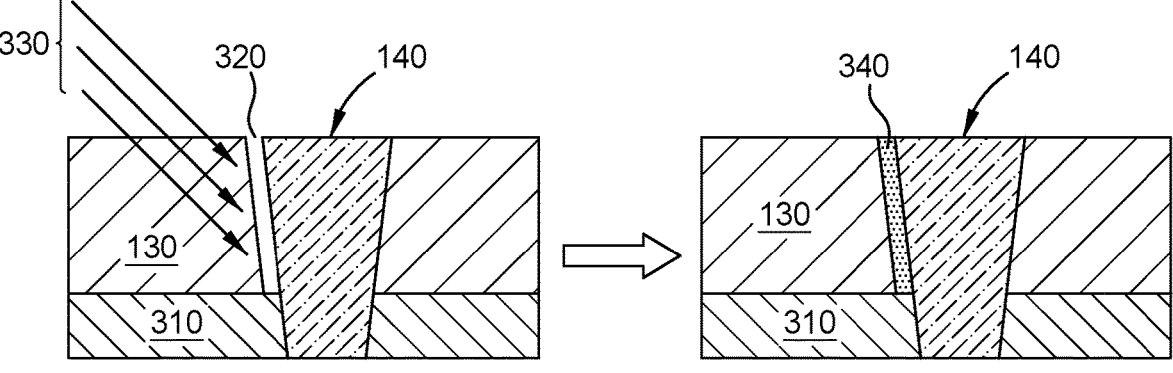
FIG. 3 illustrates a cross-sectional view of a portion of a semiconductor device formed using the method of FIG. 2, according to one or more embodiments of the present disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, of a component upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

FIG. 1 illustrates a side cross-sectional view of interconnects formed in a substrate 110 and a dielectric layer 130, in which one or more embodiments of the present disclosure may be implemented.

As shown, a first set of metal fill layers 120 may be formed in the substrate 110. The dielectric layer 130 may be deposited over the substrate 110 and metal fill layers 120, and a second set of metal fill layers 140 may be formed in the dielectric layer 130. As shown, the second set of metal fill layers 140 may be aligned such that the second set of metal fill layers 140 are directly above, and in contact with, the first set of metal fill layers 120.

In some embodiments, selective metal fill layers are sometimes used in middle-of-line vias. For example, the second set of metal fill layers 140 may be selective metal fill layers. The selective metal fill layers may be, for example, tungsten (W), aluminum (Al), molybdenum (Mo), cobalt (Co), titanium (Ti), tantalum (Ta), zirconium (Zr), platinum (Pt), zinc (Zn), hafnium (Hf), lead (Pb), nickel (Ni), iron (Fe), niobium (Ni), vanadium (V), or silicon (Si). In some embodiments, the selective metal fill layers include a metal that has a desirable Pilling-Bedworth ratio, such as a high Pilling-Bedworth ratio greater than one. The selective metal fill layers may be referred to as liner-less fill layers because they don't require a conformal liner. Liner-less fill layers generally have a lower resistance than fill layers with liners, and may therefore be preferable in some devices. However, sometimes liner-less fill layers may have adhesion issues with the surrounding dielectrics, which leads to the presence of via voids (e.g., gaps) at the interface between the metal fill layer and the dielectric layer(s). These gaps may lead to defects in other areas of the circuit. For example, the gaps can create yield defectivity problems in the formed circuits, due to the diffusion and/or presence of residual wet etching chemical components, plasma etching chemical components, polishing slurry components, and/or cleaning chemistries, which then attack metal interconnect structures and/or underlying films during subsequent processing steps. Accordingly, there is a need for methods to prevent or repair gaps at the interface between the metal fill layer and the dielectric layer.

FIG. 2 illustrates a method of forming a semiconductor device, according to one or more embodiments of the present disclosure.

The method 200 may begin at activity 210 with forming a dielectric layer (e.g., the dielectric layer 130) over a surface of a substrate. In some embodiments, the dielectric material may be formed by depositing a stoichiometric dielectric film on the substrate. The process of forming the dielectric layer can be completed by use of an atomic layer deposition (ALD) process, chemical vapor deposition (CVD) process, physical vapor deposition (PVD) process, or other useful deposition process. The method 200 may involve, at activity 220, forming one or more openings in the dielectric layer. The one or more openings may be formed by etching the one or more openings in the stoichiometric dielectric film.

At activity 230, the method 200 may involve filling the one or more openings with a metal (e.g., any of the metals listed above), wherein the metal is disposed on a surface of each of the one or more openings. Filling the one or more openings with a metal may form a set of metal fill layers, such as the second set of metal fill layers 140. The process of forming the metal fill layers can be completed by use of an atomic layer deposition (ALD) process, chemical vapor deposition (CVD) process, physical vapor deposition (PVD) process, or other useful deposition process. It is desirable for the deposition process performed during activity 230 to be formed by a selective deposition process that does not form a layer of overburden material on the field region of the substrate (i.e., region of the substrate surface between the openings) to avoid the need to perform a chemical mechanical polishing (CMP) process to remove the overburden layer. FIG. 1 illustrates a desirably formed metal layer that does not include an overburden layer.

However, in some embodiments, the method 200 may optionally include removing any overburden formed on or above the "field region" of the substrate during activity 230. In one example, the process of removing overburden may include the use of a slurry-less chemical mechanical polishing (CMP) process. If overburden removal is performed, the substrate will need to cleaned and dried.

At activity 240, as illustrated in FIG. 3, the method 200 includes implanting an oxygen containing species into the dielectric layer to provide a dose of the oxygen containing species to the surface of each of the one or more openings and the metal layer disposed therein (e.g., metal fill layer 140). The implantation process may cause a localized metal oxide layer to form (e.g., grow) on the exposed surface of the metal fill layer at the interface with the surface of an opening formed in the dielectric layer.

In some embodiments, implanting the oxygen containing species involves using a tilted-beam implant process. In some embodiments, implanting the oxygen containing species involves annealing the dielectric layer 130 and the metal fill layer 140 to promote the formation of the metal oxide. In some case, activity 240 may also include heating the patterned dielectric layer after implanting the oxygen containing species to cause the surface of each of the one or more openings and the metal fill layer exposed to the dose of the oxygen containing species to oxidize. In one embodiment, the implant process comprises high temperature tilted implant beam implant process, which includes an oxygen species in the beam. The implantation process may also be performed using a thermion hot implant, or any other appropriate means of oxidizing the dielectric layer.

In one example, the process of implanting the oxygen containing species into the dielectric layer 130 and metal fill layer 140 may include implanting an oxygen containing species while the substrate is maintained a temperature of between 20 and 500° C. In some examples, a dose between $10^{14}$ and $10^{17}$ of the oxygen containing species may be implanted using an implantation energy between <0.5 eV and >25 eV. The oxygen containing species may be implanted at a tilt angle between 0 and 75. During implantation, the substrate may be rotated in increments (e.g., 90 degrees, 180 degrees) so that all exposed surfaces of the metal fill layer 140 may be implanted with the oxygen containing species. The substrate may also be annealed at a temperature of between 300 and 600° C., for a period of time between 5 and 120 seconds after performing the implant process.

In certain embodiments, implanting the oxygen containing species into the dielectric layer and metal fill layers may cause a metal oxide layer to grow on exposed surfaces of the metal fill layers, thereby closing any gaps formed between the metal fill layers and the dielectric layer due poor adhesion of the metal fill layer and the dielectric layer.

FIG. 3 illustrates cross-sectional views of the dielectric layer 130 and metal fill layer 140 before and after the activity 240 in the method 200 of FIG. 2. In some embodiments, as shown, an intervening dielectric layer 310 may disposed under the dielectric layer 130. In some embodiments, the intervening dielectric layer 310 may be considered part of the dielectric layer 130. As shown, an opening may be formed in both the dielectric layer 130 and the intervening dielectric layer 310, and the metal fill layer 140 may be disposed on a surface of the openings in both the dielectric layer 130 and the intervening layer 310.

The cross-sectional view to the left of the arrow in FIG. 3 illustrates the dielectric layer 130 and metal fill layer 140 prior to the activity 240 of FIG. 2. As shown, a gap 320, created due to adhesion issues, exists between the metal fill layer 140 and the dielectric layer 130. During activity 240, an oxygen containing species 330 is implanted into the dielectric layer to provide a dose of the oxygen containing species 330 to the surface of each of the one or more openings and the metal fill layer 140 disposed therein. In some embodiments, implanting the oxygen containing species 330 may involve using a hot oxygen tilted implant process, as illustrated. In some embodiments, the process of implanting the oxygen containing species into the dielectric layer comprises performing an ultra-shallow implant such that the depth of the implanted oxygen containing species will substantially reach at least one of the surface of the one or more openings and the metal disposed thereon. In general, it is desirable for the ultra-shallow implant process to be performed such that the implanted species do not significantly damage the surface of the metal fill layer 140 positioned adjacent to the surface of the opening. The dose of the oxygen containing species can be greater than $1 \times 10^{20}$ atoms/ $cm^2$.

The cross-sectional view to the right of the arrow in FIG. 3 illustrates the dielectric layer 130 and the metal fill layer 140 after the activity 240 of FIG. 2 (e.g., the dielectric layer 130 and the metal fill layer 140 are implanted with the oxygen containing species 330).

After trench patterning, fill, and CMP planarization, the dielectric layer 130 and the metal fill layer 140 may be implanted with an oxygen containing compound (e.g. using thermion hot implantation). As shown in the right side cross-sectional view in FIG. 3, a metal oxide layer 340 has grown on the exposed surface of the metal fill layer 140 as a result of the implantation process(es) performed during activity 240. In some embodiments, the implantation causes a metal oxide layer 340 to form (e.g., grow) on the exposed surface of the metal fill layer 140. The metal oxide layer 340 thereby closes any gaps (e.g., gap 320) at the interface between the metal fill layer 140 and the dielectric layer 130. In one example, the metal fill layer 140 may be tungsten, and the metal oxide layer 340 may be a localized tungsten oxide (e.g., WOx, $W_2O_3$, $WO_5$, etc.).

In some embodiments, the metal fill layer 140 may be any suitable metal with a high Pilling-Bedworth ratio (e.g., with a Pilling-Bedworth ratio greater than 1). It is believed that utilizing a metal layer that has a high Pilling-Bedworth ratio can be used to ensure that the metal fill layer 140 will form the metal oxide layer 340 with sufficient volume expansion to fill the gaps at the interface between the metal fill layer 140 and the dielectric layer 130. Such metals may be, for example, tungsten (W), aluminum (Al), molybdenum (Mo), cobalt (Co), titanium (Ti), tantalum (Ta), zirconium (Zr), platinum (Pt), zinc (Zn), hafnium (Hf), lead (Pb), nickel (Ni), iron (Fe), niobium (Ni), vanadium (V), or silicon (Si).

In some embodiments, at least the surface of the metal fill layer that is adjacent to the surface of the openings is exposed to a dose of an implanted hydrogen species. The surface of the metal fill layer may then be exposed to a process of implanting germanium. Hydrogen content can be increased by: 1) the addition of $H_2$ gas in the process; 2) lowering the deposition temp; 3) lowering the plasma power; and 4) lowering the oxidizer concentration. Typical hydrogen content in the film lies within 3% to 50%, the benefits of increasing hydrogen content is higher etch rate, lower etch selectivity, lower film stress, lower density, and higher transparency.

In some embodiments, the dielectric layer 130 and/or the metal fill layer 140 may be implanted with heavy impurities (e.g., germanium (Ge) or argon (Ar)). Implanting heavy impurities into the dielectric layer 130 and/or the metal fill layer 140 causes a mechanical volume expansion. Accordingly, gaps at the interface between the metal fill layer 140 and the dielectric layer 130 may be filled without use of a chemical reaction (e.g., without oxidation).

The methods described herein may have additional beneficial uses other than via void repair. For example, the methods described herein may also be utilized to create compressive stress on or within various components (e.g., metal fill layer 140) of a to be formed IC device. The generated compressive stress can be used to alter the conductivity and/or contact resistance of portions of the interconnect structure within a formed IC device.

Figure 4:
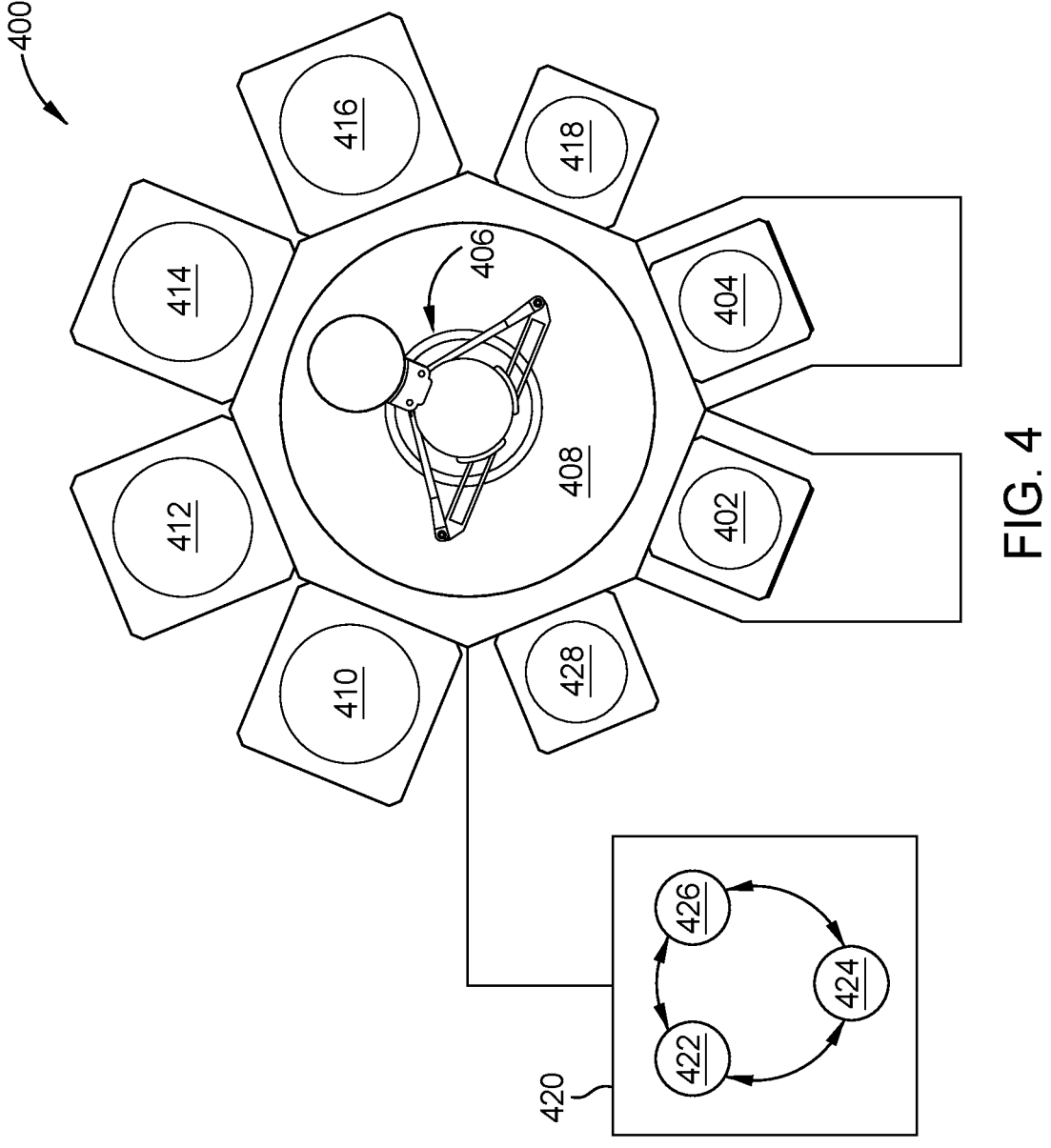
FIG. 4 illustrates a multi-chamber processing system, which may be used to implement one or more embodiments of the present disclosure.

FIG. 4 illustrates a multi-chamber processing system 400. The processing system 400 may include load lock chambers 402, 404, a robot 406, a transfer chamber 408, processing chambers 410, 412, 414, 416, 418, 428, and a controller 420. The load lock chambers 402, 404 allow for the transfer of substrates (such as substrates 110, not shown) into and out of the processing system 400. Load lock chambers 402, 404 may pump down the substrates introduced into the processing system 400 to maintain a vacuum seal. The robot 406 may transfer the substrates between load lock chambers 402, 404 and the processing chambers 410, 412, 414, 416, 418, and 428. The robot 406 may also transfer the substrates between the load lock chambers 402, 404 and the transfer chamber 408.

Each processing chamber 410, 412, 414, 416, 418, and 428 may be outfitted to perform a number of substrate operations such as atomic layer deposition (ALD), chemical vapor deposition (CVD), physical vapor deposition (PVD), dry etch, pre-clean, de-gas, thermal processing (e.g., anneal), orientation, or other substrate processes. Additionally, each processing chamber 410, 412, 414, 416, 418, and 428 may be outfitted to deposit a dielectric barrier layer, deposit a dielectric layer, form one or more vias and/or trenches in the stack, perform one or more pre-clean processes, deposit the first metal material layer, and deposit the second metal material layer.

The controller 420 may be configured to operate all aspects of the processing system 400, such as the method 200 disclosed in FIG. 2. For example, the controller 420 may be configured to control the methods of forming a dielectric layer (e.g., dielectric layer 130) on a substrate, forming one or more openings in the dielectric layer, filling the one or more openings with a metal (e.g., metal fill layer 140), and implanting an oxygen containing species into the dielectric layer to provide a dose of the oxygen containing species to the surface of each of the one or more openings and the metal disposed therein.

Each processing chamber 410, 412, 414, 416, 418, and 428 may be capable of rotating the substrate so that the side walls on each side of the metal fills may be treated with the tilted oxygen implantation. For example, the substrate may be rotated in increments of 90 degrees or 180 degrees.

The controller 420 includes a programmable central processing unit (CPU) 422 that is operable with a memory 424 and a mass storage device, an input control unit, and a display unit (not shown), such as power supplies, clocks, cache, input/output (I/O) circuits, and the liner, coupled to the various components of the processing system to facilitate control of the substrate processing. The controller 420 also includes hardware for monitoring substrate processing through sensors in the processing system 400, including sensors monitoring the precursor, process gas, and purge gas flow. Other sensors that measure system parameters, such as substrate temperature, chamber atmosphere pressure, and the like, may also provide information to the controller 420.

To facilitate control of the processing system 400 described above, the CPU 422 may be one of any form of general purpose computer processor that can be used in an industrial setting, such as a programmable logic controller (PLC), for controlling various chambers and sub-processors. The memory 424 is coupled to the CPU 422 and the memory 424 is non-transitory and may be one or more of readily available memory such as random access memory (RAM), read only memory (ROM), floppy disk drive, hard disk, or any other form of digital storage, local or remote. Support circuits 426 are coupled to the CPU 422 for supporting the processor in a conventional manner. Charged species generation, heating, and other processes are generally stored in the memory 424, typically as software routine. The software routine may also be stored and/or executed by a second CPU (not shown) that is remotely located from the hardware being controlled by the CPU 422.

The memory 424 is in the form of computer-readable storage media that contains instructions, that when executed by the CPU 422, facilitates the operation of the processing system 400. The instructions in the memory 424 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

The method 200 discussed above may not be tied solely to the processing system 400. For example, one or more steps of the method 200 may be performed in a processing chamber exterior to the processing system 400.

While the foregoing is directed to embodiments of the present disclosure, other and further embodiments of the disclosure may be devised without departing from the basic scope thereof, and the scope thereof is determined by the claims that follow.

What is claimed is:

1. A method for fabricating a semiconductor device, comprising:

depositing a stoichiometric film;

forming one or more openings in the stoichiometric film;

depositing a liner in the one or more openings, the liner comprising a nonstoichiometric compound, wherein the stoichiometric film and the liner form a dielectric layer;

filling the one or more openings with a metal, wherein the metal is disposed on a surface of each of the one or more openings; and exposing the dielectric layer and the metal disposed in the one or more openings to an oxidizing atmosphere, wherein exposing the dielectric layer and the metal causes oxidation of the nonstoichiometric compound.

2. The method of claim 1, wherein the nonstoichiometric compound of the dielectric layer comprises a silicon-rich silicon oxide.

3. The method of claim 1, wherein the exposing the dielectric layer and the metal disposed in the one or more openings to an oxidizing atmosphere comprises annealing the nonstoichiometric compound in a low-temperature oxidizing ambient.

4. The method of claim 1, wherein the exposing the dielectric layer and the metal disposed in the one or more openings to an oxidizing atmosphere causes the dielectric layer at the surface of each of the one or more openings to grow.

5. The method of claim 1, wherein the exposing the dielectric layer and the metal disposed in the one or more openings to an oxidizing atmosphere causes the dielectric layer at the surface of each of the one or more openings to expand.

6. The method of claim 1, wherein the filling the one or more openings with the metal further comprises forming a layer of the metal on a surface of the dielectric layer, and the method further comprises:

removing the layer of the metal from the surface of the dielectric layer before exposing the dielectric layer and the metal disposed in the one or more openings to an oxidizing atmosphere.

7. A method for fabricating a semiconductor device, comprising:

exposing a patterned dielectric layer disposed on a substrate to an oxidizing atmosphere, wherein:

the patterned dielectric layer comprises a first dielectric layer having openings, the first dielectric layer comprising:

a stoichiometric film in which the openings are formed; and a liner in one or more of the openings, the liner comprising a nonstoichiometric compound, each of the openings comprises a metal layer that is disposed on a surface of the opening, the first dielectric layer comprises the nonstoichiometric compound, and exposing the patterned dielectric layer to an oxidizing atmosphere causes oxidation of the nonstoichiometric compound at the surfaces of the openings.

8. The method of claim 7, wherein the nonstoichiometric compound of the first dielectric layer comprises a silicon-rich silicon oxide.

9. The method of claim 7, wherein the exposing the patterned dielectric layer to an oxidizing atmosphere comprises annealing the nonstoichiometric compound in a low-temperature oxidizing ambient.

10. The method of claim 7, wherein the exposing the patterned dielectric layer to an oxidizing atmosphere causes the dielectric layer at the surface of one or more of the openings to grow.

11. The method of claim 7, wherein the exposing the patterned dielectric layer to an oxidizing atmosphere causes the dielectric layer at the surface of one or more of the openings to expand.

* * * * *